United States Patent

Hsu et al.

[11] Patent Number: 5,393,691
[45] Date of Patent: Feb. 28, 1995

[54] FABRICATION OF W-POLYCIDE-TO-POLY CAPACITORS WITH HIGH LINEARITY

[75] Inventors: Shung-Liang Hsu, Taipei; Mou-Shiung Lin; Ming-Dar Lei, both of Hsinchu, all of Taiwan, Prov. of China

[73] Assignee: Taiwan Semiconductor Manufacturing Company, Hsinchu, Taiwan, Prov. of China

[21] Appl. No.: 102,977

[22] Filed: Jul. 28, 1993

[51] Int. Cl.⁶ .................. H01L 21/70; H01L 27/00
[52] U.S. Cl. .................................. 437/60; 437/47; 437/919; 437/200
[58] Field of Search .............. 437/919, 60, 52, 47, 437/200

[56] References Cited

U.S. PATENT DOCUMENTS

| | | | |
|---|---|---|---|
| 4,971,924 | 12/1988 | Tigelaar et al. | 437/60 |
| 5,037,772 | 8/1991 | McDonald | 437/52 |
| 5,130,267 | 7/1992 | Kaya et al. | 437/47 |
| 5,173,437 | 12/1992 | Chi | 437/60 |
| 5,218,511 | 6/1993 | Nariani | 361/313 |

FOREIGN PATENT DOCUMENTS 0183623 6/1986 European Pat. Off. .

Primary Examiner—Olik Chaudhuri
Assistant Examiner—H. Jey Tsai
Attorney, Agent, or Firm—George O. Saile; Stephen B. Ackerman

[57] ABSTRACT

A method of forming a polycide-to-polysilicon capacitor with a low voltage coefficient and high linearity is described. A a first layer of polysilicon, having a suitable doping concentration, is deposited on the surface of the substrate and the field oxide regions. A layer of silicide is deposited over the polysilicon layer. The layer of silicide and the layer of polysilicon on the field oxide region are patterned, to form a polycide bottom plate of the capacitor. The polycide bottom plate is annealed. Sidewalls are formed on the sides of the polycide bottom plate. The polycide bottom plate is ion implanted in a vertical to produce the low voltage coefficient and high linearity. An interpoly dielectric layer is formed and patterned on the surface of the polycide bottom plate to act as a dielectric for the polycide-to-polysilicon capacitor. The interpoly dielectric layer is densified. A second layer of polysilicon, having a suitable doping concentration, is deposited on the surface of the dielectric layer and on the surface of the substrate and the field oxide regions. The second layer of polysilicon is patterned to form the top plate of the capacitor.

18 Claims, 6 Drawing Sheets

FABRICATION OF W-POLYCIDE-TO-POLY CAPACITORS WITH HIGH LINEARITY

BACKGROUND OF THE INVENTION (1) Field of the Invention

The invention relates to the manufacture of highly dense integrated circuits and more particularly to the formation of polycide-to-polycrystalline silicon capacitors and metal oxide semiconductor (MOS) field effect transistor devices within the integrated circuit.

(2) Description of the Prior Art

In recent years there continues to be dramatic density increases in the integrated circuit technology. The minimum feature size of lithography has been reduced to one micrometer and below. In the fabrication of precision capacitors in conjunction with MOS devices on the same chip at these reduced dimensions, it is increasingly difficult to maintain such parameters as low voltage and temperature coefficients and low leakage current.

Workers in the field have described the formation of capacitors using two layers of polysilicon. McDonald in U.S. Pat. No. 5,037,772 describes a method for fabricating a polysilicon-to-polysilicon capacitor on the same chip as CMOS and BiCMOS devices. A first polysilicon layer is deposited and ion-implanted with arsenic. A silicon oxide/silicon nitride dielectric layer is then formed and patterned to the capacitor dimensions. A second polysilicon layer is deposited. An anisotropic etch is then performed, with the dielectric layer acting as a mask to protect the first polysilicon layer.

In European Patent Application 0 183 623, Krishner also describes a process for producing a precision polysilicon-to-polysilicon capacitor in conjunction with MOS devices on the same chip. However, it is noted that the deposition of silicon nitride as part of the dielectric layer causes uniformity problems, due to the difficulty of depositing a uniformly thick layer of the silicon nitride. Thus in this invention a single layer of thermally grown silicon dioxide is used as the capacitor dielectric. The oxidation process includes an annealing step. The dielectric layer is grown from a first polysilicon layer that has been ion-implanted with phosphorus or arsenic. A low energy implant is described which allows for precise control of the subsequent dielectric thickness. However, neither this approach nor that in U.S. Pat. No. 5,037,772 directly addresses the problems of non-linearity and instability of the capacitor voltage coefficient, high voltage and temperature coefficients, high leakage current, and unstable oxide capacitance, as feature sizes are reduced to one micrometer and less.

In addition, the use of polycide gates and capacitors, polycide being a combination of layers of polysilicon and a refractory metal silicide, is becoming very important as the industry moves to smaller device geometries. As these geometries become smaller, polysilicon becomes less satisfactory due to its high resistivity and the subsequent affect on RC time delays and IR voltage drops. The use of a combination of refractory metal silicides with polysilicon has proven suitable because of its lower resistivity.

Polycide has typically been used in the prior art in precision capacitors in the formation of the bottom capacitor plate. The rest of the capacitor is formed by adding a dielectric and a polysilicon top plate. However, as feature sizes are reduced to one micrometer or less, this structure has the problems of non-linearity and instability of the capacitor voltage coefficient, high voltage and temperature coefficients, and unstable oxide capacitance.

SUMMARY OF THE INVENTION

It is therefore a principal object of the invention to provide a method for making a polycide-to-polysilicon capacitor and field effect transistor integrated circuit which by the nature of the method will provide for a highly linear voltage coefficient of the capacitor, low voltage and temperature coefficients, lower leakage current in the interpoly oxide, improved voltage coefficient stability, and stable oxide capacitance.

It is a further object of this invention to provide a method that will save one mask step by ion implanting the capacitor bottom plate at the same time as the ion implantation of the source/drain regions of the MOS device.

These objects are achieved by fabricating an integrated circuit which includes a polycide-to-polysilicon capacitor and a CMOS device with polycide gate. Field oxide isolation regions, n-well and p-well regions, and gate oxide regions are formed in a silicon substrate. A first polysilicon layer is formed over the gate oxide and field oxide isolation regions, and doped to a suitable doping concentration. A layer of silicide is formed over the first polysilicon layer, and is then annealed in oxygen. The first polysilicon layer and the silicide layer are patterned to form the gate electrode of the CMOS device, and the bottom plate of the polycide-to-polysilicon capacitor. Lightly-doped drain regions are formed in the CMOS device. Sidewalls are formed on the gate electrode and capacitor bottom plate. The capacitor bottom plate and N- regions of the CMOS device are ion implanted in a vertical direction in separate steps. The remaining active regions of the CMOS device are then ion-implanted with a second and opposite conductivity-imparting dopant. An interpoly oxidation layer is formed over the capacitor bottom plate, field oxide regions, and the CMOS device. It acts as a dielectric for the capacitor, and to isolate the CMOS device from subsequent layers. A second polysilicon layer is formed over the interpoly oxidation layer and patterned to form the capacitor top plate, and doped with a suitable doping concentration. Remaining layers are then formed, including contacts, metallization, and passivation, to complete formation of the integrated circuit.

Also in accordance with the present invention, there is the resulting integrated circuit device structure that is formed by the method described above. This integrated circuit structure includes a polycide-to-polysilicon capacitor, and CMOS devices with polycide gate, which are separated from each other by means of field oxide isolate regions. N-well and P-well regions, and gate oxide regions, are located in and on the silicon substrate. A polycide-to-polysilicon capacitor is located on the surface of the field oxide isolation region. The polycide-to-polysilicon capacitor includes an ion-implanted polycide bottom plate consisting of an upper layer of silicide and a lower layer of polysilicon. An interpoly oxidation layer acts as the dielectric for the capacitor. A second polysilicon layer having a suitable doping concentration is located on the interpoly oxidation layer and forms the top plate of the polycide-to-polysilicon capacitor. A polycide gate, which is ion-implanted and formed from a lower layer of polysilicon and an upper layer of silicide, is located on the n-well and p-well regions, and acts as the gate electrode of the CMOS device. Sidewalls are located on the sides of the polycide gate and the polycide bottom plate. Double-doped drain regions in the silicon substrate and adjacent to the polycide gate electrodes are ion-implanted to form the active regions of the CMOS device. Remaining layers including contacts, metallization, and passivation, complete formation of the integrated circuit.

DESCRIPTION OF THE PREFERRED EMBODIMENTS

Figure 1:
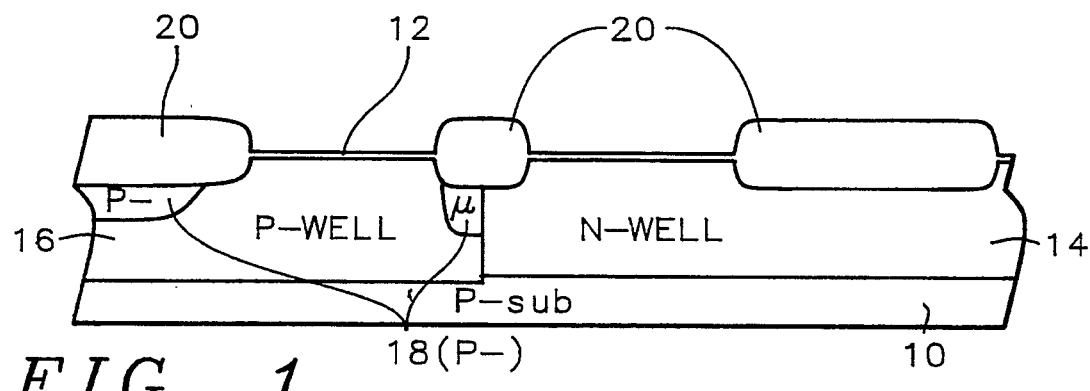
FIGS. 1 to 8 are a schematic cross-sectional representation of a new method for fabricating a polycide-to-polysilicon capacitor in conjunction with a metal oxide silicon field effect transistor, which has a highly linear voltage coefficient of the capacitor, low voltage and temperature coefficients, lower leakage current in the interpoly oxide, improved voltage coefficient stability, and stable oxide capacitance.

Referring now to FIG. 1, there is shown a partially completed structure, formed by means well known in the art, for building an integrated circuit with CMOS devices and capacitors. See the description of a twin-tub process in *VLSI Technology*, 2nd edition, S. M. Sze, pp. 485–486, McGraw-Hill Book Company, Singapore, 1988. A lightly doped p-type substrate 10 is shown, preferably composed of silicon having a (100) crystallographic orientation. The surface of the silicon substrate 10 is thermally oxidized to form a pad oxide 12 to a thickness of between about 200 and 400 Angstroms. An N-well region 14 is formed by ion implantation of phosphorus, with the P-well region masked by a layer of silicon nitride ($Si_3N_4$). A well oxide (not shown) is then grown selectively over the N-well region, and a P-well region 16 is formed by ion implantation with boron. The N-well and P-well regions are driven in at a temperature of between about 1050° and 1200° C. A channel stop field implant 18 is formed by an ion implant of boron in the P-well region 16. The surface of the silicon substrate 10 is then thermally oxidized at a temperature of between about 950° and 1000° C. and to a thickness of between about 5000 and 7500 Angstroms to form field oxide regions 20. The field oxide regions are used to isolate semiconductor regions from other such regions, and to isolate the capacitor from the semiconductor regions.

Figure 2:
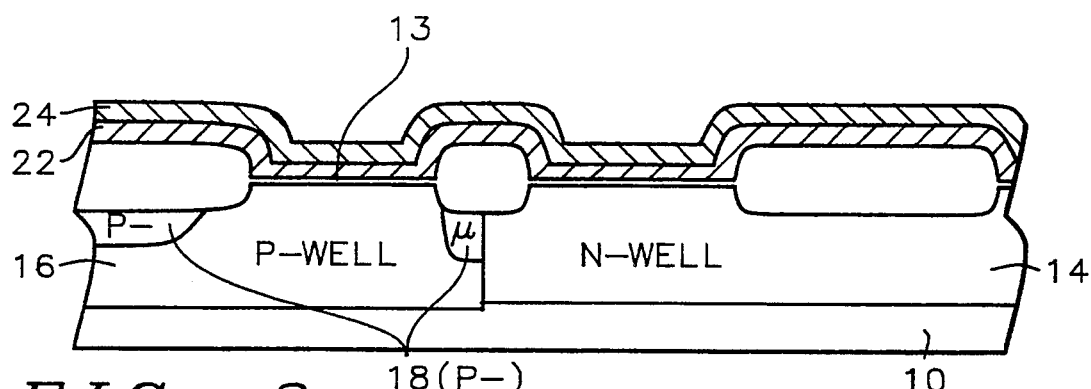

Referring now to FIG. 2, pad oxide 12 has been removed and gate oxide 13 thermally grown to a thickness of between about 100 and 200 Angstroms. First polysilicon layer 22 is blanket deposited over gate oxide 13 and field oxide regions 20, by LPCVD (Low Pressure Chemical Vapor Deposition) method. The preferred thickness of the polysilicon layer 22 is between about 1500 and 2000 Angstroms. The polysilicon layer 22 is doped by diffusion with phosphorus using phosphorus oxychloride ($POCl_3$) as a source at a temperature of between about 800° and 920° C. Tungsten silicide ($WSi_x$) layer 24 is blanket deposited over polysilicon layer 22 by LPCVD method, by reacting tungsten fluoride ($WF_6$) with silane ($SiH_4$). The preferred thickness of this layer is between about 1500 and 2000 Angstroms.

The amorphous refractory metal silicide layer has a chemical formulation of $WSi_x$, where x is between 2.6 and 2.8. An x value above this range would result in an undesirably high resistivity for the silicide film. An x value below this range increases the stress of the $WSi_x$ film and leads to adhesion problems between the silicide and polysilicon.

Figure 3:
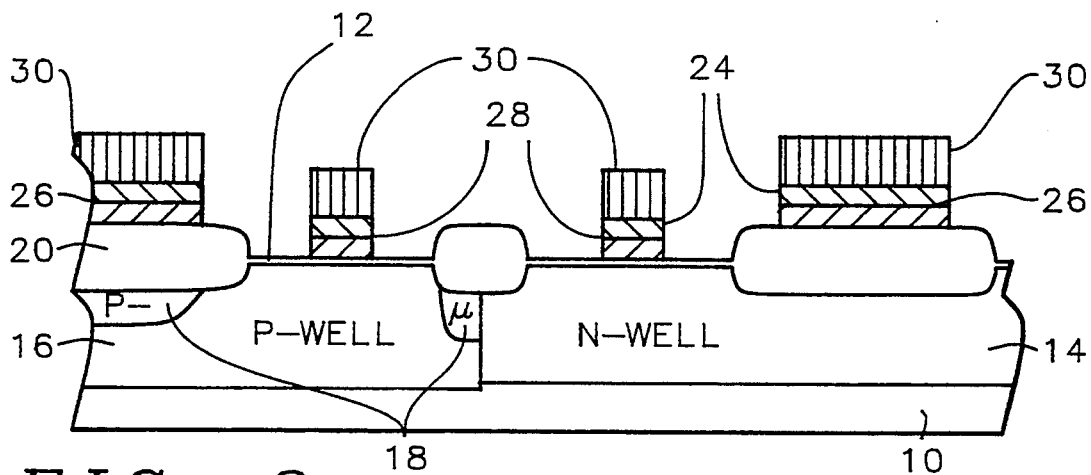

Referring now to FIG. 3, a lithography mask is formed by conventional lithography and etching techniques on the tungsten silicide layer 24. The polycide bottom capacitor plate 26 and polycide gate electrodes 28 are formed by anisotropic reactive ion etching. Photoresist 30 is removed and the silicide layer annealed at a temperature of between about 900° and 950° C. for between about 30 and 60 minutes, to cause the amorphous refractory metal silicide to change into its crystalline phase.

The structure of the CMOS FET may now be formed by the following steps. However, it is well understood by those skilled in the art that a P channel FET or N channel FET integrated circuit device could also be formed simply by using dopants of a single conductivity.

Figure 4:
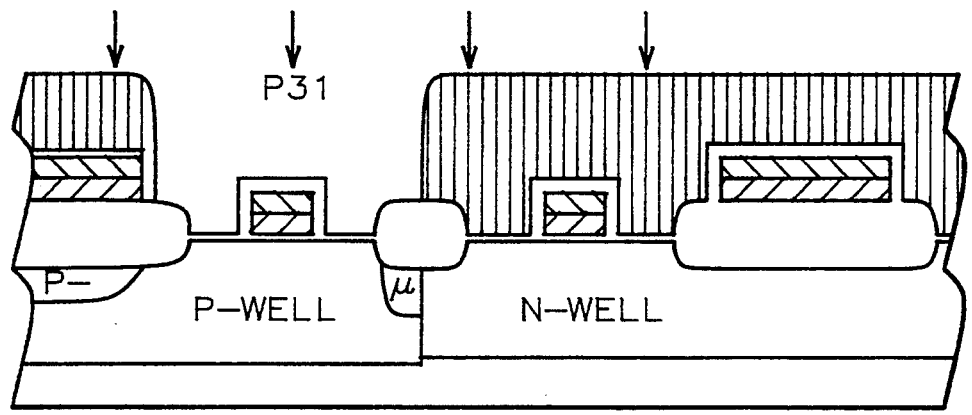

Referring now to FIG. 4, all regions of the structure except the active device region of the p-well are masked by suitable lithography and etching, for N− ion implantation. Phosphorus ($P_{31}$) is ion implanted to form double-doped drain regions, at an energy of between about 60 and 80 KeV, and at a dose of between about $1 \times 10^{13}$ and $3 \times 10^{13}$ atoms/cm.$^2$.

Figure 5:
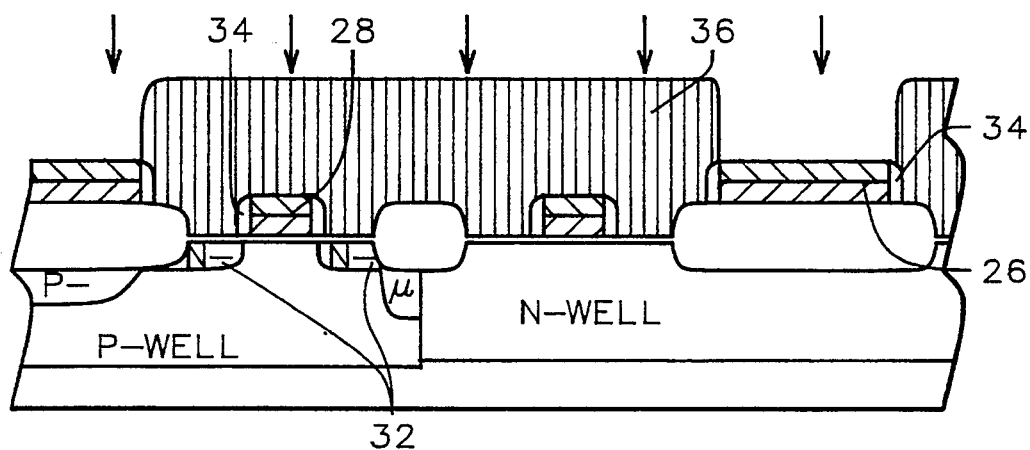

The resulting N− regions 32 are shown in FIG. 5. The dielectric spacers 34 are now to be formed followed by the completion of the lightly doped drain source/drain structures and the polycide-to-polysilicon capacitor. A low temperature silicon oxide deposition is preferred such as through the chemical vapor deposition of tetraethoxysilane (TEOS) at a temperature in the range of between about 650° and 750° C. wherein the low temperature range process uses plasma enhanced CVD. Other silicon oxide deposition methods include silane based LPCVD. The thickness of the dielectric silicon oxide layer (not shown) is between about 2000 and 3000 Angstroms.

An anisotropic etching of this layer produces the dielectric spacers 34 on the sidewalls of the gate electrodes 28 and capacitor bottom plate 26. The preferred anisotropic etching uses a conventional reactive ion etching ambient.

Critical ion implantation steps are now performed. In the preferred embodiment, an N+ ion implantation is performed on the polycide bottom plate 26 of the capacitor, and in a separate step on the N-regions 32 of the CMOS device. A lithographic mask is formed using standard lithographic techniques and suitable etching to expose the silicide surface of the capacitor polycide bottom plate, as shown in FIG. 5. The polycide bottom plate ion implantation is with Arsenic, $As75$ with a dose of between about 1 E 14 and 1 E 16 atoms/cm.$^2$, and an energy of between about 60 and 120 KeV. A lower dosage implant than that used for the CMOS N− regions is preferred, to help the adhesion problem at the interface between the silicide and the oxide layer formed on top of the silicide in a subsequent processing step.

The photoresist 36 is stripped, and another lithographic mask formed by suitable lithography and etching techniques, with the lithographic mask pattern the same as shown in FIG. 4, to prepare for ion implantation of the N-regions of the CMOS device. A higher dosage implant using Arsenic, AS75 is completed, with a dose of between about 1 E 15 and 6 E 15 atoms/cm.$^2$, and an energy of between about 60 and 120 KeV. This completes the source/drain regions of the N channel FET portion of the CMOS FET.

Figure 6:
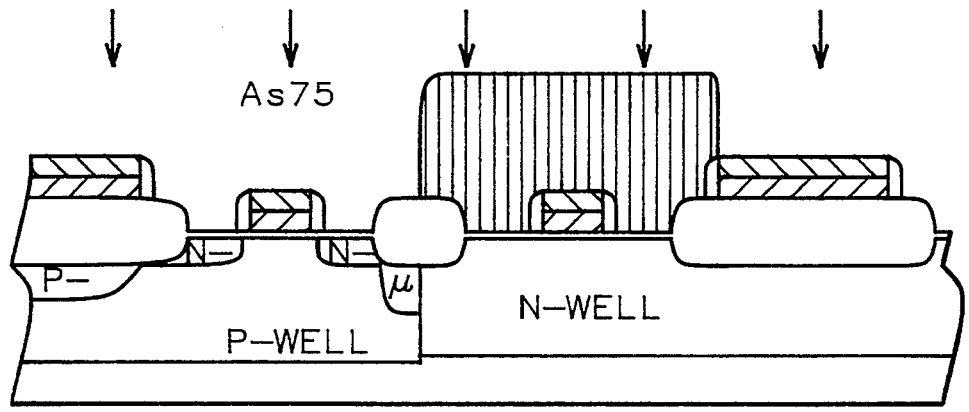

In a further embodiment of the invention shown in FIG. 6, one lithographic mask may be saved by ion implanting the N-regions of the CMOS device and the silicide layer of the capacitor polycide bottom plate in the same processing step. An arsenic AS75 implant dose of between about 1 E 15 and 6 E 15 atoms/cm.$^2$, and an energy of between about 60 and 120 KeV is used.

The silicide and CMOS N− regions could also be ion implanted with phosphorus. Using the two-mask method, the implant dose for the silicide bottom capacitor plate with phosphorus is between about 1 E 14 and 1 E 16 atoms/cm.$^2$, with an energy of between about 60 and 90 KeV. The implant dose for the N-regions is between about 1 E 15 and 5 E 15 atoms/cm.$^2$, with an energy of between about 60 and 90 KeV. Using phosphorus with only one mask to ion implant both the silicide bottom plate and the N− regions requires an implant dose of between about 1 E 15 and 5 E 15 atoms/cm.$^2$, with an energy of between about 60 and 90 KeV.

A P+ ion implantation is now performed to complete the P channel FET of the CMOS device. A lithographic mask is formed and patterned by suitable lithography and etching techniques to expose the N-well region. An ion implantation of boron BF$_2$ is performed, with a dose of between about 1 E 15 and 5 E 15 atoms/cm.$^2$, at an energy of between about 50 and 80 KeV.

In a further embodiment of this invention, the polycide bottom capacitor plate could be ion-implanted with the P+ implant instead of the N+ implant. Using the two-mask method, the BF$_2$ implant dose for the silicide bottom capacitor plate would be between about 5 E 14 and 1 E 16 atoms/cm.$^2$, with an energy of between about 50 and 80 KeV. The implant dose for the P regions of the CMOS device would be between about 1 E 15 and 5 E 15 atoms/cm.$^2$, with an energy of between about 50 and 80 KeV. Using BF$_2$ with only one mask to ion implant both the silicide bottom plate and the P regions would require an implant dose of between about 1 E 15 and 5 E 15 atoms/cm.$^2$, with an energy of between about 50 and 80 KeV.

Figure 7:
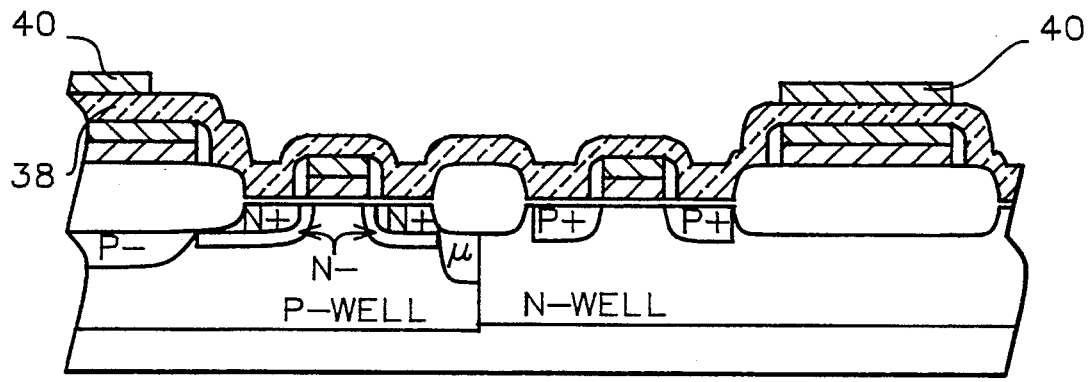

As shown in FIG. 7, a thin silicon oxide layer 38 is formed upon the capacitor bottom plate and the CMOS device. This serves as the dielectric for the capacitor, and a surface damage masking layer for the rest of the integrated circuit. The conditions for forming this layer 38 are LPCVD deposition of tetraethoxysilane (TEOS) at about 650° to 750° C. The thickness of this oxide layer is dependent on the feature size of the integrated circuits being processed. For one-micron processing, the oxide layer thickness is between about 1000 and 1400 Angstroms. For 0.6-to-0.8 micron processing, the oxide layer thickness is between about 600 and 800 Angstroms. This silicon oxide layer 38 is then densified at a temperature of between about 750° and 850° C. for between about 20 and 40 minutes. This causes the deposited silicon oxide to take on many of the characteristic properties of a thermally grown oxide.

A second polysilicon layer is now blanket deposited over silicon oxide layer 38 by LPCVD method. The preferred thickness of the polysilicon layer is between about 2000 and 3500 Angstroms. The polysilicon layer is doped by diffusion with phosphorus using phosphorus oxychloride (POCl$_3$) as a source at a temperature of between about 850° and 920° C. Referring to FIG. 7, the capacitor top plate 40 is now formed by conventional lithography and etching of the second polysilicon layer. This completes formation of the polycide-to-polysilicon capacitor structure.

Figure 8:
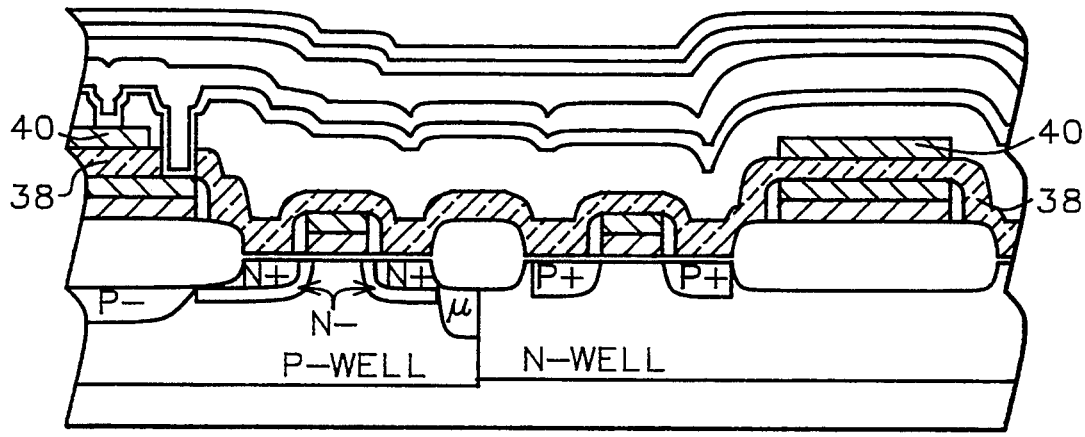

Referring now to FIG. 8, the integrated circuit is completed by forming a passivation layer over the structures described and appropriate electrical connecting structures thereover to electrically connect the gate electrode structures, capacitor and source/drain elements. FIG. 8 shows some of these layers and structures. These steps are not described in detail as they are conventional and not significant to the invention.

Figure 9:
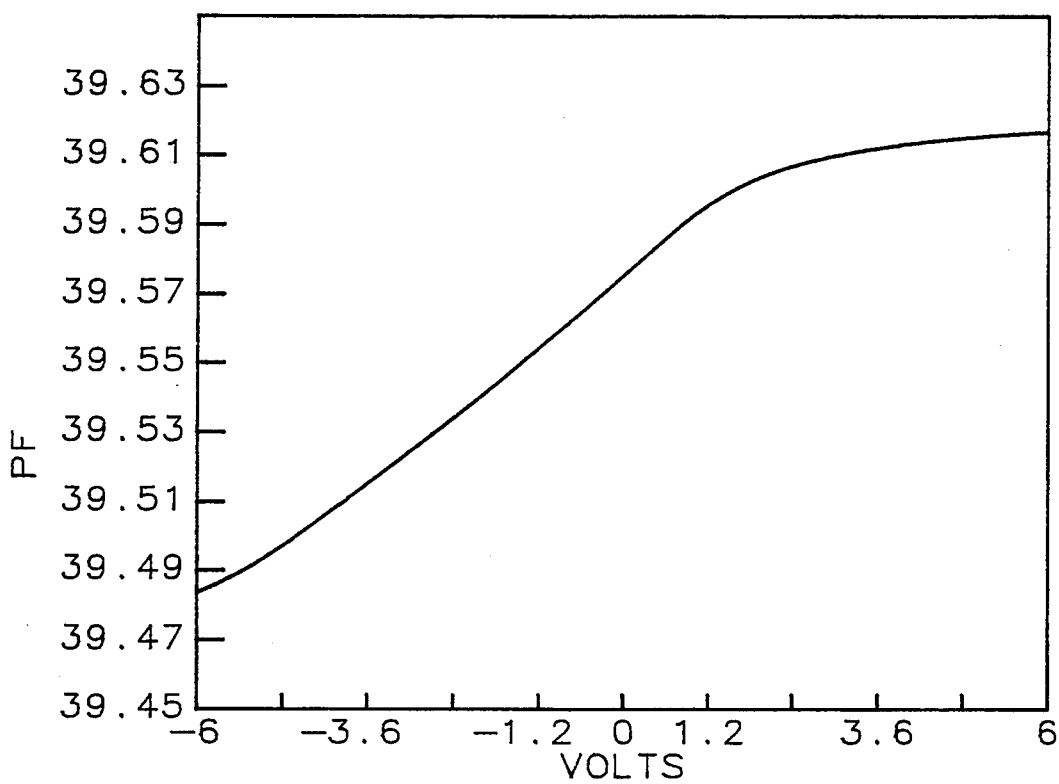
FIG. 9 demonstrates graphically the non-linear nature of capacitance over a voltage range, using a prior art process without an ion implant.

Some advantages of the invention over the prior art are shown graphically in FIGS. 9 to 14. FIG. 9 demonstrates the non-linear nature of capacitance over a voltage range, for a sample product using the prior art process in which the capacitor bottom plate is not ion-implanted. The change of the capacitance over a voltage range is known as the voltage coefficient, or Vcc. It is desirable to have as low a Vcc as possible, as well as high stability, or linearity. In the FIG. 9 sample, the Vcc at −5 volts (−5 v) is 203.14 parts per million (ppm) per volt (v). The Vcc at +5 volts (+5 v) is 409.86 ppm/v.

Figure 10:
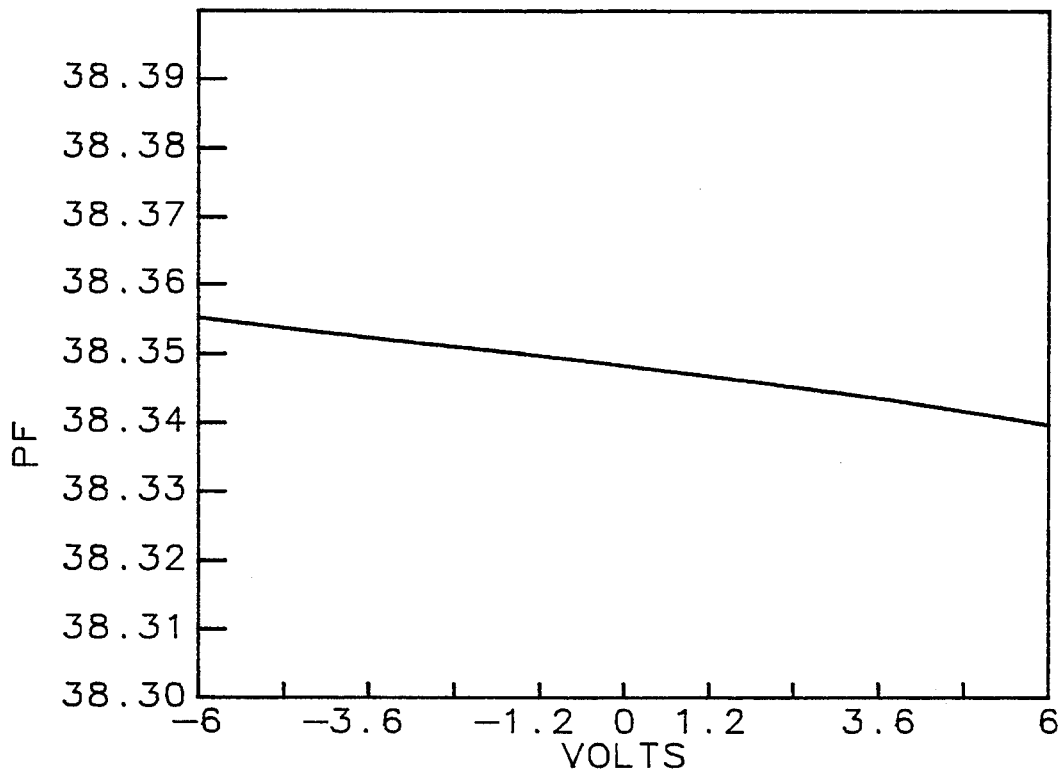
FIGS. 10 and 11 demonstrate graphically the highly linear capacitance using the new method of ion implanting the polycide bottom plate, with either of two opposite conductivity-imparting dopants.
Figure 11:
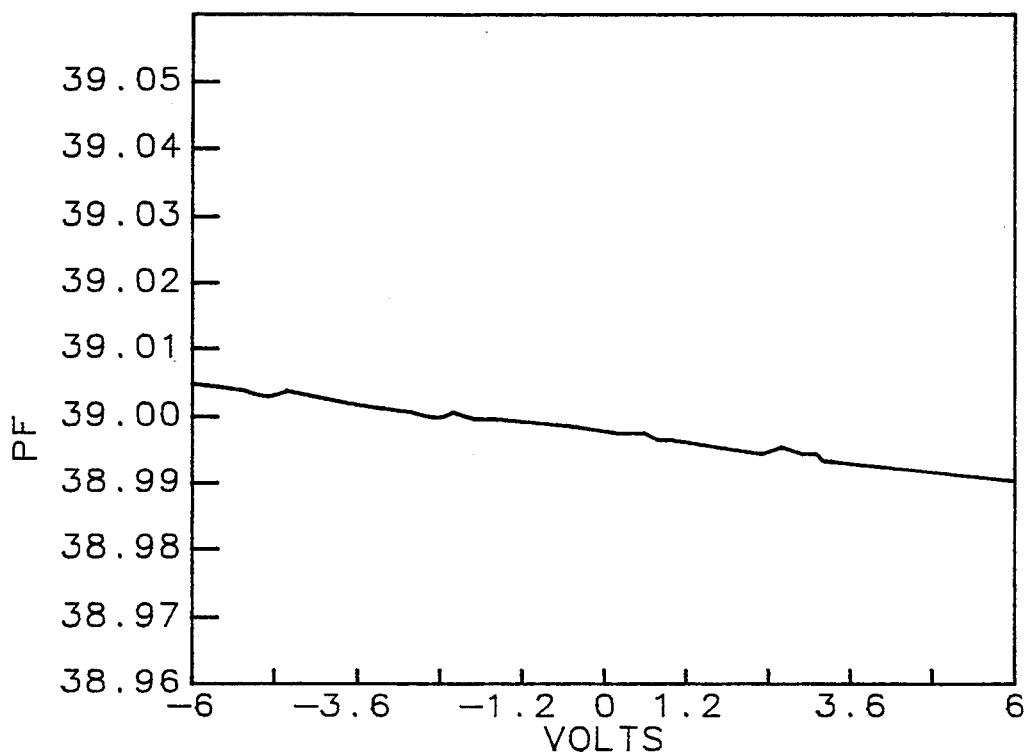

FIGS. 10 and 11 demonstrate graphically the highly linear capacitance using the new method of ion implanting the polycide bottom plate, with either of two opposite conductivity-imparting dopants. FIG. 10 shows the capacitance of a sample in which the polycide bottom plate of the capacitor has been heavily implanted with an N+ dopant, such as arsenic. In this sample, the Vcc (−5 v) is 34.41 ppm/v, much lower than the FIG. 9 sample. Vcc (+5 v) is 34.94 ppm/v. These two FIG. 10 Vcc measurements are almost identical, indicating the high Vcc linearity of the N+ implanted capacitor.

The FIG. 11 sample has been heavily implanted with a P+ dopant such as BF$_2$. Vcc (−5 v) is 40.00 ppm/v while Vcc (+5) is 34.57 ppm/v. A low, stable voltage coefficient is also indicated by these measurements.

Figure 12:
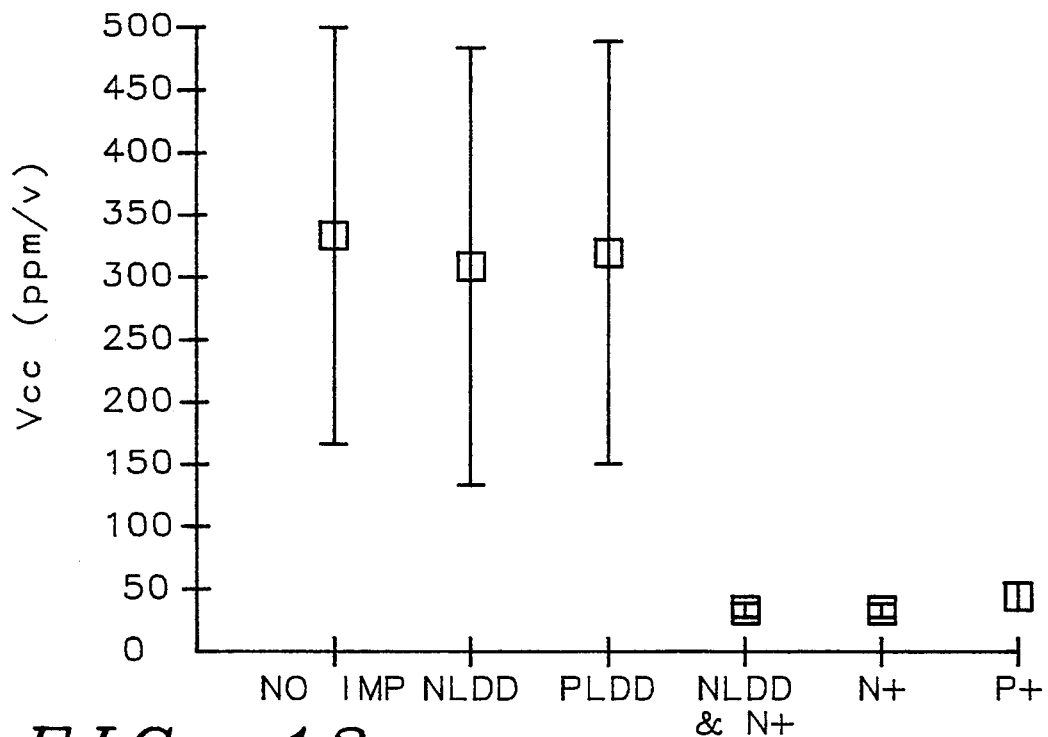
FIG. 12 demonstrates graphically the very low and stable voltage coefficient of the capacitor using the new method.

FIG. 12 demonstrates graphically the very low and stable voltage coefficient of the capacitor using the new method. Each set of data points was derived from characterization experiments, and is based on ten measurements taken from two wafers, for each condition. The first three conditions indicate the unstable and high Vcc for a polycide capacitor with no implant, an N LDD (lightly doped drain) implant and a P LDD implant. The LDD implant dosage of approximately 1 E 13 atoms/cm.$^2$ is too low to improve Vcc. The fourth, fifth and sixth conditions are based on the invention, and show the low and very stable, reproducible Vcc that result from the heavy implant of the new method.

Figure 13:
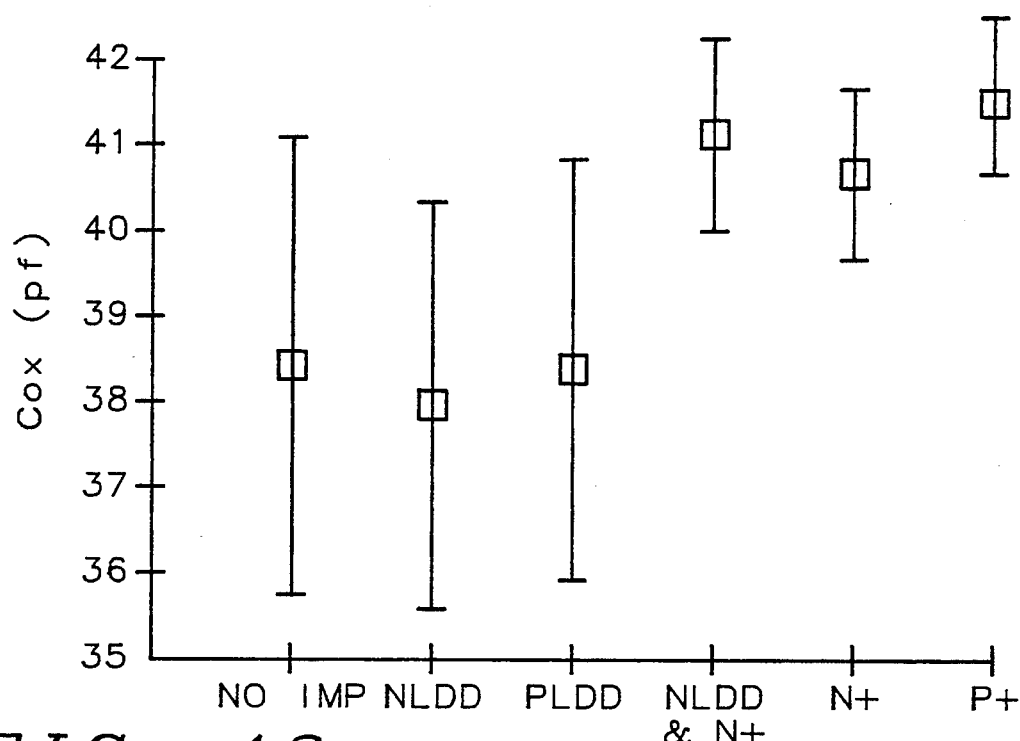
FIG. 13 demonstrates graphically the more stable oxide capacitance using the new method.

FIG. 13 demonstrates graphically the more stable oxide capacitance using the new method. As in FIG. 12, the first three conditions are for prior art processes using no implant and two LDD implants. Ten measured data points were taken from two wafers for each condition in the figure. The last three conditions show the higher capacitance value and more stable capacitance range due to the heavy N+ or P+ implants of the invention. The higher capacitance can also be attributed to a thinner interpoly oxide.

The following table shows a further advantage of the invention, a lower temperature coefficient, Tcc. The temperature coefficient is the measurement of the change in capacitance vs. a change in temperature. A low Tcc is important for precise capacitor-based CMOS integrated circuits as used for analog applications. Shown in the table are capacitance values at different temperatures for an experiment with no implant, N+ implant, and P+ implant. The improved Tcc values for the N+ and P+ implanted capacitors are shown at the bottom of the table and are 19.89 and 17.56 ppm/°C., respectively, while the capacitor with no implant has a Tcc of 21.48 ppm/°C.

| °C. | no implant | N+ implant | P+ implant |
| --- | --- | --- | --- |
| 20 | 91.16 | 98.43 | 99.52 |
| 40 | 91.17 | 99.51 | 99.56 |
| 60 | 91.22 | 98.54 | 99.60 |
| 80 | 91.25 | 98.56 | 99.61 |
| 100 | 91.27 | 98.58 | 99.62 |
| 120 | 91.34 | 98.63 | 99.69 |
| 140 | 91.40 | 98.67 | 99.73 |
| Tcc (ppm/°C.): | 21.48 | 19.89 | 17.56 |

Figure 14:
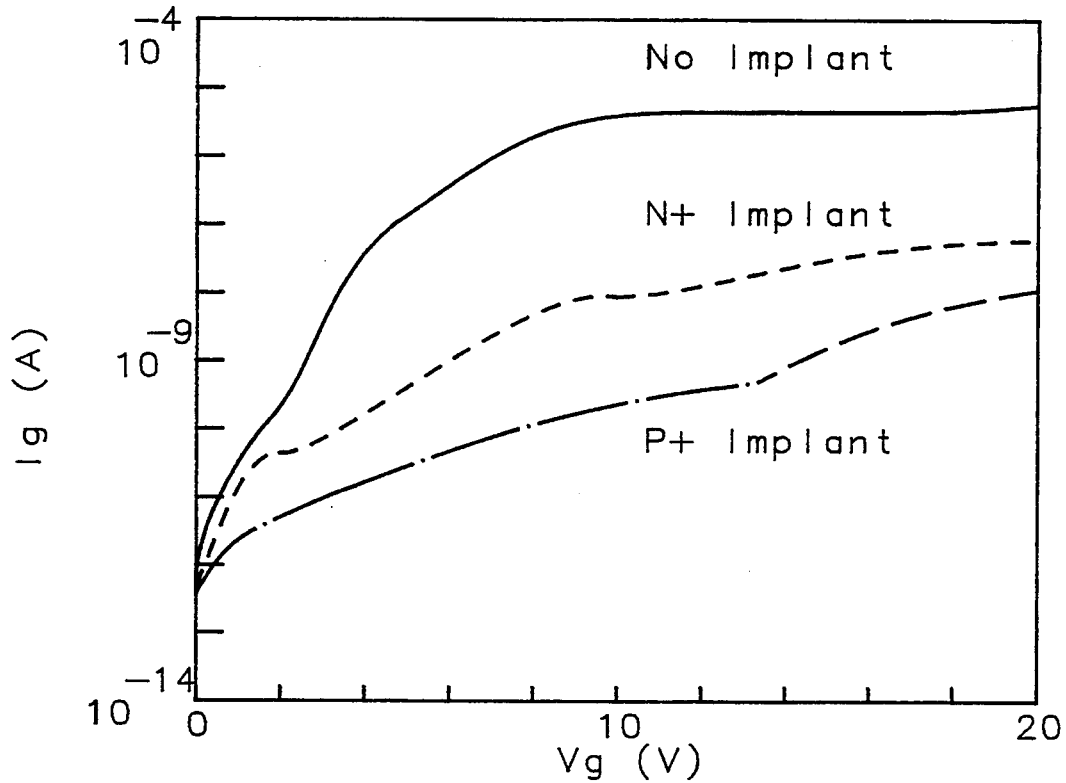
FIG. 14 demonstrates graphically the lower leakage current ($I_G$) using the new method.

FIG. 14 demonstrates the lower leakage current of the invention. For the indicated voltage range, the leakage current is lower for both the heavy N+ and P+ implants as compared to the prior art process with no implant.

The invention also results in a thinner oxide for the capacitor. With the heavy ion implant, the presence of fluorine (F−) ions prevents oxidation at the interface of the tungsten silicide and oxide dielectric, with a resultant thinner oxide. The capacitance C is defined by the equation $$C = (e_{ox}/T_{ox})A$$

where $e_{ox}$ is the dielectric constant of the oxide, $T_{ox}$ is the oxide thickness, and A is the capacitor area. With the thinner oxide of the invention, the capacitor area can be reduced to provide the same capacitance value.

While the invention has been particularly shown and described with reference to the preferred embodiments, it will be understood by those skilled in the art that various changes in form and details may be made without departing from the spirit and scope of the invention. For example, while the detailed examples of the integrated circuit device are CMOS, it is obvious to those skilled in the art that p-channel or n-channel MOS FET devices can also be fabricated in conjunction with a polycide-to-polysilicon capacitor as part of this invention.

What is claimed is:

1. A method for forming a polycide-to-polysilicon capacitor, in and on a silicon substrate, on an integrated circuit having MOSFET devices which are separated from each other by means of field oxide regions, comprising:

forming a first layer of doped polysilicon on the surface of said substrate and said field oxide regions;
   depositing a layer of silicide over said first layer of doped polysilicon;
   patterning said layer of silicide and said first layer of doped polysilicon on said field oxide region, to form a polycide bottom plate of said capacitor;
   annealing said polycide bottom plate;
   forming sidewalls on the sides of said polycide bottom plate;
   ion implanting in a vertical direction into said polycide bottom plate;
   forming and patterning an interpoly dielectric layer on the surface of said polycide bottom plate to act as a dielectric for said polycide-to-polysilicon capacitor;
   densifying said interpoly dielectric layer;
   forming a second layer of doped polysilicon on the surface of said dielectric layer and on the surface of said substrate and said field oxide regions; and
   patterning said second layer of doped polysilicon to form the top plate of said capacitor.

2. The method of claim 1 wherein said ion implanting is with arsenic, in a concentration of between about 1 E 14 and 1 E 16 atoms/cm$^2$.

3. The method of claim 2 wherein said arsenic is ion implanted at an energy of between about 60 and 120 KeV.

4. The method of claim 1 wherein said silicide is tungsten silicide.

5. The method of claim 1 wherein said polycide bottom plate is annealed at a temperature of between about 850° and 1000° C.

6. The method of claim 1 wherein said ion implanting is with phosphorus, in a concentration of between about 1 E 14 and 1 E 16 atoms/cm$^2$, at an energy of between about 60 and 90 KeV.

7. The method of claim 1 wherein said ion implanting is with boron fluoride, in a concentration of between about 1 E 15 and 5 E 15 atoms/cm$^2$, at an energy of between about 50 and 80 KeV.

8. The method of claim 1 wherein said first layer of doped polysilicon is deposited to a thickness of between about 1500 and 2000 Angstroms.

9. The method of claim 1 wherein said first layer of doped polysilicon is doped by diffusion of POCl$_3$ at a temperature of between about 800° and 920° C.

10. The method of claim 1 wherein said layer of silicide is deposited to a thickness of between about 1500 and 2000 Angstroms.

11. The method of claim 1 wherein said interpoly dielectric layer is tetraethoxysilane (TEOS) deposited to a thickness of between about 1000 and 1400 Angstroms when used in 1-micron processing.

12. The method of claim 1 wherein said interpoly dielectric layer is tetraethoxysilane (TEOS) deposited to a thickness of between about 600 and 800 Angstroms when used in 0.6 to 0.8-micron processing.

13. The method of claim 1 wherein said intermoly dielectric layer is densified at a temperature of between about 750° and 850° C.

14. The method of claim 1 wherein said second layer of doped polysilicon is deposited to a thickness of between about 2500 and 3500 Angstroms.

15. A method for forming an integrated circuit in and on a silicon substrate, with a polycide-to-polysilicon capacitor and with a CMOS device with polycide gate, comprising:

forming field oxide regions, n-well and p-well regions, and gate oxide regions in and on said silicon substrate;

forming a first doped polysilicon layer on said gate oxide and said field oxide regions;

depositing a layer of silicide on said first doped polysilicon layer;

annealing said layer of silicide;

patterning said first doped polysilicon layer and said silicide layer to form gate electrode of said CMOS device, and to form a polycide bottom plate of said polycide-to-polysilicon capacitor;

forming lightly-doped drain regions in said CMOS device;

forming sidewalls on said gate electrode and on said polycide bottom plate;

ion implanting in a vertical direction into said polycide bottom plate;

ion implanting in a vertical direction into said lightly-doped drain regions of said CMOS device;

ion implanting remaining active regions of said CMOS device with a second and opposite conductivity-imparting dopant;

depositing an interpoly oxidation layer on the surfaces of said polycide bottom plate, said CMOS device, and said field oxide regions, to act as a dielectric for said polycide-to-polysilicon capacitor, and to isolate said CMOS device from subsequent layers;

densifying said interpoly oxidation layer;

forming a second doped polysilicon layer over the surface of said interpoly oxidation layer;

patterning said second doped polysilicon layer to form a polysilicon top plate of said polycide-to-polysilicon capacitor, having a suitable doping concentration; and forming remaining layers to complete said integrated circuit.

16. The method of claim 15 wherein said ion implanting in a vertical direction of said polycide bottom plate and said lightly-doped drain regions of said CMOS device is done simultaneously.

17. The method of claim 16 wherein said ion implanting is with arsenic, in a doping concentration of between about 1 E 15 and 6 E 15 atoms/cm$^2$.

18. The method of claim 17 wherein said arsenic is ion implanted at an energy of between about 60 and 120 KeV.

* * * * *